(12) United States Patent
Atherton

(10) Patent No.: US 12,287,357 B2
(45) Date of Patent: Apr. 29, 2025

(54) POWER CORD VOLTAGE INDICATOR

(71) Applicant: John C. Atherton, Beaverton, OR (US)

(72) Inventor: John C. Atherton, Beaverton, OR (US)

(*) Notice: Subject to any disclaimer, the term of this patent is extended or adjusted under 35 U.S.C. 154(b) by 185 days.

(21) Appl. No.: 18/340,691

(22) Filed: Jun. 23, 2023

(65) Prior Publication Data

US 2024/0426877 A1    Dec. 26, 2024

(51) Int. Cl.
| | | |
|---|---|---|
| *G01R 19/155* | (2006.01) | |
| *G02F 1/133* | (2006.01) | |
| *G02F 1/1333* | (2006.01) | |

(52) U.S. Cl.
CPC ....... *G01R 19/155* (2013.01); *G02F 1/13306* (2013.01); *G02F 1/133308* (2013.01)

(58) Field of Classification Search
CPC .............. G01R 19/155; G02F 1/133308; G02F 1/13306
See application file for complete search history.

(56) References Cited

U.S. PATENT DOCUMENTS

| | | |
|---|---|---|
| 1,229,699 A | 6/1917 | Armor |
| 2,094,645 A | 10/1937 | Foulke |
| 2,449,150 A | 9/1948 | Schnoll |
| 4,251,770 A | 2/1981 | Schweitzer, Jr. |
| 4,504,781 A | 3/1985 | Hargrove |
| 4,714,916 A | 12/1987 | Schweitzer, Jr. |
| 4,829,289 A | 5/1989 | Kallman |
| 5,003,249 A | 3/1991 | Bird |
| 5,065,142 A | 11/1991 | Green |
| 5,070,301 A | 12/1991 | Schweitzer, Jr. |
| 5,077,520 A | 12/1991 | Schweitzer, Jr. |
| 5,095,265 A | 3/1992 | Schweitzer, Jr. |
| 5,363,088 A | 11/1994 | Schweitzer, Jr. |
| 5,374,923 A | 12/1994 | Sakamoto |
| 5,424,630 A | 6/1995 | Vazquez |
| 5,428,288 A | 6/1995 | Foreman |
| 6,157,184 A | 12/2000 | Atherton |
| 6,313,635 B1 | 11/2001 | Noll |

(Continued)

FOREIGN PATENT DOCUMENTS

| | | |
|---|---|---|
| CA | 474305 A | 6/1951 |
| CA | 728300 A | 2/1966 |

(Continued)

*Primary Examiner* — Minh Q Phan
(74) *Attorney, Agent, or Firm* — Raven Patents, LLC; Anton E. Skaugset

(57) ABSTRACT

Voltage indicators, and their use to detect and indicate the presence of single-phase AC voltage in an electrical power cord. The voltage indicators include a housing that can be reversibly closed around the power cord; a status indicator including a high-impedance display having first and second display electrodes connected in parallel with a static suppression resistor, a conductive wire electrically coupled to the second display electrode at a first end, having a conductive grounding loop at the second end; and a first carbon-impregnated conductive foam pad electrically coupled to the first display electrode, where when the housing is closed around the power cord the first and a second carbon-impregnated conductive foam pads capacitively couple with the power cord, so that the resulting capacitive current creates an observable change in the high-impedance display.

11 Claims, 8 Drawing Sheets

(56) References Cited

U.S. PATENT DOCUMENTS

| | | |
|---|---|---|
| 8,058,879 B1 | 11/2011 | Atherton |
| 10,641,800 B2 | 5/2020 | Galla |
| 11,137,422 B2 | 10/2021 | Guy |
| 11,280,815 B2 | 3/2022 | Stollwerck |
| 2006/0009059 A1* | 1/2006 | Gentle .................. H01R 31/06 439/181 |
| 2006/0164068 A1 | 7/2006 | Czyzewski |
| 2014/0049398 A1 | 2/2014 | Kovacich |
| 2021/0072289 A1 | 3/2021 | Peretto |
| 2021/0281021 A1 | 9/2021 | Castro |

FOREIGN PATENT DOCUMENTS

| | | | |
|---|---|---|---|
| CA | 993952 | A | 7/1976 |
| CH | 221666 | A | 6/1942 |
| WO | 2013038343 | A1 | 3/2013 |
| WO | 2018185365 | A1 | 10/2018 |

\* cited by examiner

POWER CORD VOLTAGE INDICATOR

TECHNICAL FIELD

The present disclosure is related to instruments for detecting the presence of an AC voltage potential on the conductors of two- or three-conductor power cords, such as those found in residential, commercial, and industrial locations for grounded power systems.

BACKGROUND

Consumers of electric power have long been inconvenienced with the problem of determining whether there is electric power going to an appliance or device that they are about to use. Traditionally they just switch on the appliance or device to see if it works. However, not all appliances can be determined to have a supply of electrical power at the moment the power switch is turned on.

Various devices for indicating whether voltage is available in power cables and extension cords have been previously described, but have exhibited one or more flaws that rendered them unsatisfactory.

Examples of this are coffee makers, soldering irons, and clothes irons that don't have visual power indicators. The voltage indicator described in the present disclosure provides a clear and almost instantaneous indication of whether power is available.

Various devices have been available previously for determining and indicating whether voltage is available in power cables and extension cords, but most have not been particularly satisfactory.

For example, U.S. Pat. No. 5,424,630 to Vazquez (1995) discloses a voltage indicator that has a knife blade as one electrical contact and an alligator clip as the other electrical contact of the voltage indicator. Two disadvantages of this indicator are readily apparent. The knife blade contact is used to cut through the insulation on the wire, thus permanently damaging it, and the alligator clip needs a grounded electrical terminal to be clipped on to complete the circuit.

U.S. Pat. No. 5,428,288 to Foreman et al. (1995) and U.S. Pat. No. 2,449,150 to Schnoll (1948) are for related indicators. In both of these patents a thin electrical connecting wafer is slid over the end of a standard male electric power plug. A common disadvantage of both of these inventions is that the thin wafer decreases the quality of the electrical connection of the male plug to the power outlet. The Foreman et al. patent also requires the use of a computer to sense a power failure while in the Schnoll patent the indicator can only be read at the male plug and not at anywhere along the length of the power cord as might be more convenient.

U.S. Pat. No. 4,829,289 to Kallman et al. (1989) and Canadian Patent No. 728,300 to Windsor (1966) are for related voltage indicators. The patents disclose an illuminated plug that can be installed between a normal power outlet and the male plug at the end of the power cord. Both of these devices have the disadvantage of being impractical for use at a power receptacle behind a piece of furniture. The device described in the Windsor patent has the additional disadvantage that an appliance or device connected through the device needs to be turned on to complete a path through the illuminated indicator in order for the device to provide a useful indication.

Swiss U.S. Pat. No. 221,666 to Gerber (1942) and Canadian Patent No. 474,305 to Simmons (1951) disclose similar voltage indicators. Both patents disclose screwdriver or pen type voltage indicators that use a return path to ground through a human being. Both devices have the disadvantage of needing to make physical contact between a probe tip and a conductor of a power cord being considered.

Canadian Patent No. 993,952 to Friesen (1976) discloses a power cord voltage indicator in which metallic contacts pierce the conductors of the power cord under test. The piercing of the power cord conductors has the disadvantage of doing permanent damage to the power cord insulation as well as the disadvantage of being unusable on power cords that are completely enclosed in a protective outer sheath.

U.S. Pat. No. 5,095,265 to Schweitzer Jr. (1992) is for a coaxial power cord voltage indicator in which capacitive sensor must pass through the outer conductive jacket of the coaxial cable in order to be operative. The patent is limited to use only in coaxial cables in which an outer sheath is electrically conductive and can act to provide a ground return path.

Other patents to Schweitzer Jr. for related devices are U.S. Pat. No. 5,070,301 (1991), U.S. Pat. No. 5,077,520 (1991), and U.S. Pat. No. 5,363,088 (1994). These voltage indicators, however, are all intended for sensing voltage in coaxial cables with a ground return on an outer coaxial conductor.

U.S. Pat. No. 7,893,686 to Atherton (2011; hereby incorporated by reference) discloses voltage indicators for use with an ordinary single-phase AC power cord of either the grounded or the ungrounded type, in which capacitive coupling takes place between an energized conductor of the power cord and a first terminal of an electronic display. However, in order for the disclosed indicators to provide a detectable indication that voltage was present in the power cord, the disclosed indicators required the user to touch a conductive element of the device. Further, the user was required to touch the conductive element every time they desired to determine if the power cord was energized.

Additionally, the disclosed mechanisms for coupling the voltage indicators of the U.S. Pat. No. 7,893,686 patent with a power cord included either a 'wrap-around' closure that typically failed to create the necessary capacitive coupling with the power cord, or a 'pliers-type' coupling that required the user to hold the indicator during use, both solutions being somewhat disadvantageous.

U.S. Pat. No. 6,157,184 (hereby incorporated by reference) discloses a voltage indicator for similar applications. The voltage indicators of the U.S. Pat. No. 6,157,184 patent included a flexible portion housing capacitor plate elements that were intended to be coupled to the power cord by wrapping the flexible portion around the power cord. Unfortunately, this 'wrap-around' coupling similarly failed to create the necessary capacitive coupling with the power cord.

What is needed is a voltage indicator that can be simply and securely coupled to a conventional alternating current power cord, such that effective capacitive coupling with a conductor in the power cord can be achieved, and that can provide an indication of whether or not the coupled power cord is energized without requiring that a user be actively holding, touching, or securing the voltage indicator.

What is desired, then, is a device that can be applied simply to a conventional alternating current power cord, at any chosen position along the power cord, and a method for sensing and providing a visible indication of whether ordinary alternating current voltage is present in the power cord. Such a device should not physically damage the power cord on which it is mounted, should not require any power source, such as a battery, of its own, and should require only a minimal amount of power, obtained from the power cord being observed. Further, the device should be capable of providing an indication of whether or not the coupled power cord is energized without requiring that a user be actively holding, touching, or securing the device.

SUMMARY

The present disclosure is directed to voltage indicators for power cords, and the use thereof. Selected examples of the disclosed voltage indicators can be readily coupled to a conventional alternating current power cord, at any chosen position along the power cord, and without damaging the power cord. Selected examples of the disclosed voltage indicators require only a minimal amount of power obtained by capacitive coupling with the power cord being observed.

In one example, the present disclosure is directed to voltage indicators for a power cord, that include a housing that is configured to be reversibly closed around the power cord; a status indicator that includes a high-impedance display having a first and a second display electrodes that are connected in parallel with a static suppression resistor, where the status indicator is disposed in or on the housing so that the high-impedance display is visible when the housing is closed around the power cord, and where an application of a current across the first and the second display electrodes creates an observable change in the high-impedance display; a conductive wire that is electrically coupled to the second display electrode at a first end of the conductive wire, and electrically coupled to a conductive grounding loop at a second end of the conductive wire; and a first carbon-impregnated conductive foam pad that is electrically coupled to the first display electrode, and the first and second carbon-impregnated conductive foam pads are positioned such that when the housing is reversibly closed around the power cord the first and second carbon-impregnated conductive foam pads are in contact with one another and the power cord is sandwiched between them; wherein when the housing of the voltage indicator is reversibly closed around the power cord, a presence of an alternating current voltage in an electrical conductor within the power cord capacitively couples with the first carbon-impregnated conductive foam pad and the second carbon-impregnated conductive foam pad, and thereby delivers a current to the high-impedance display of the status indicator, resulting in the observable change in the high-impedance display.

In another example, the present disclosure is directed to methods of indicating a presence of an alternating current voltage within a power cord, where the voltage indicator includes a status indicator having a high-impedance display, where the status indicator is disposed in or on the housing so that the high-impedance display is visible when the voltage indicator housing is closed around the power cord; the high-impedance display having a first and a second display electrodes that are connected in parallel with a static suppression resistor, so that an application of a current across the first and the second display electrodes creates an observable change in the high-impedance display; a first carbon-impregnated conductive foam pad that is electrically coupled to the first display electrode, and the first and second carbon-impregnated conductive foam pads are positioned such that when the housing is reversibly closed around the power cord the first and second carbon-impregnated conductive foam pads are in contact with one another and the power cord is sandwiched between them; wherein an alternating current voltage in the electrical conductor within the power cord will capacitively couple with the first carbon-impregnated conductive foam pad and the second carbon-impregnated conductive foam pad, and thereby deliver a current to the high-impedance display of the status indicator, resulting in the observable change in the high-impedance display. The methods of indicating of the present disclosure include reversibly closing the housing of the voltage indicator around the power cord; observing the status indicator; and correlating an observable change in the high-impedance display with the presence of an alternating current voltage within the power cord.

The features, functions and advantages of the voltage indicators and methods discussed herein can be achieved independently in various embodiments of the present disclosure or may be combined in yet other embodiments, further details of which can be seen with reference to the following description and drawings below.

DETAILED DESCRIPTION

Figure 1:
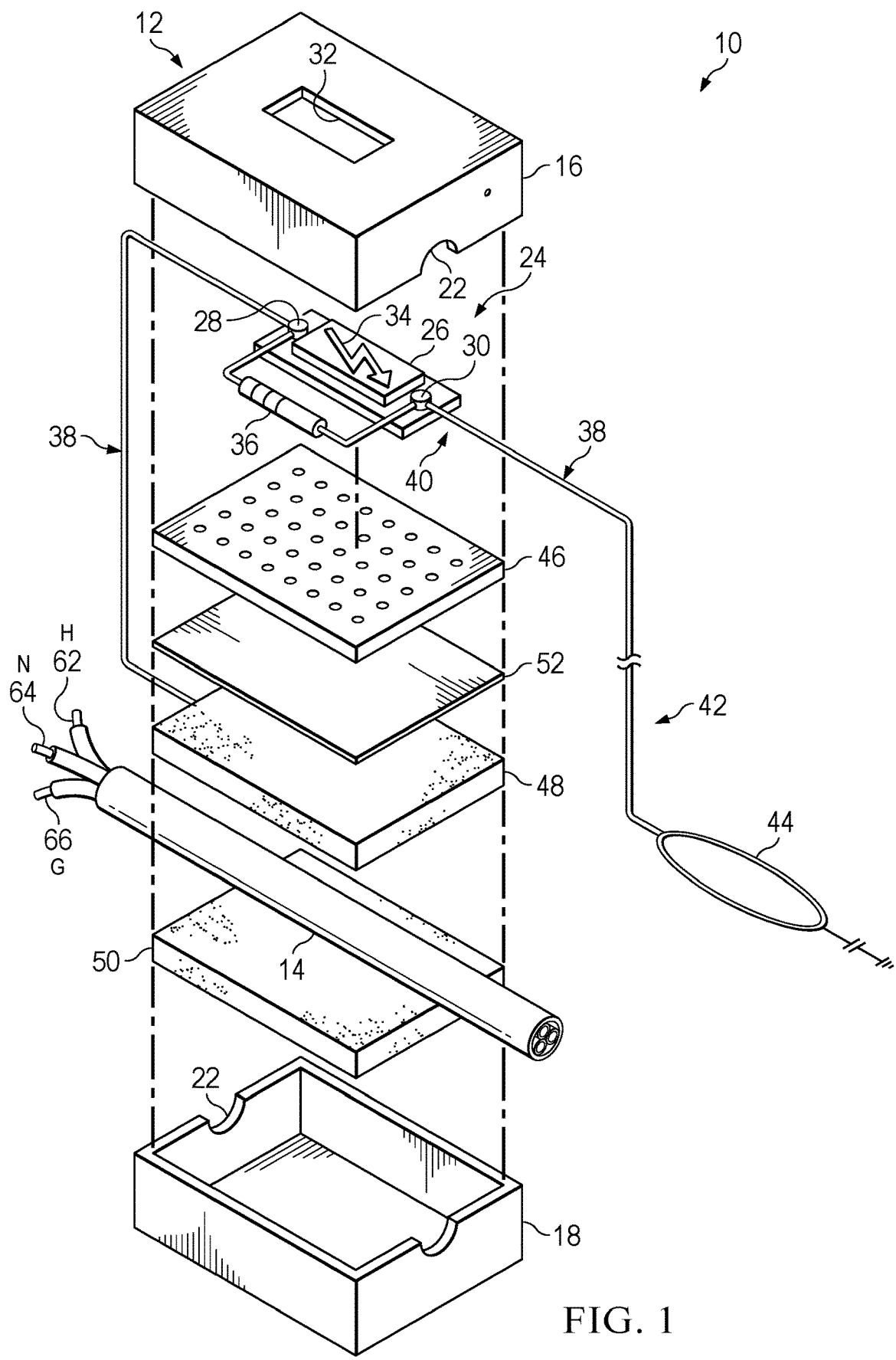
FIG. 1 is a semi-schematic exploded view of an exemplary voltage indicator according to the present disclosure.
Figure 2:
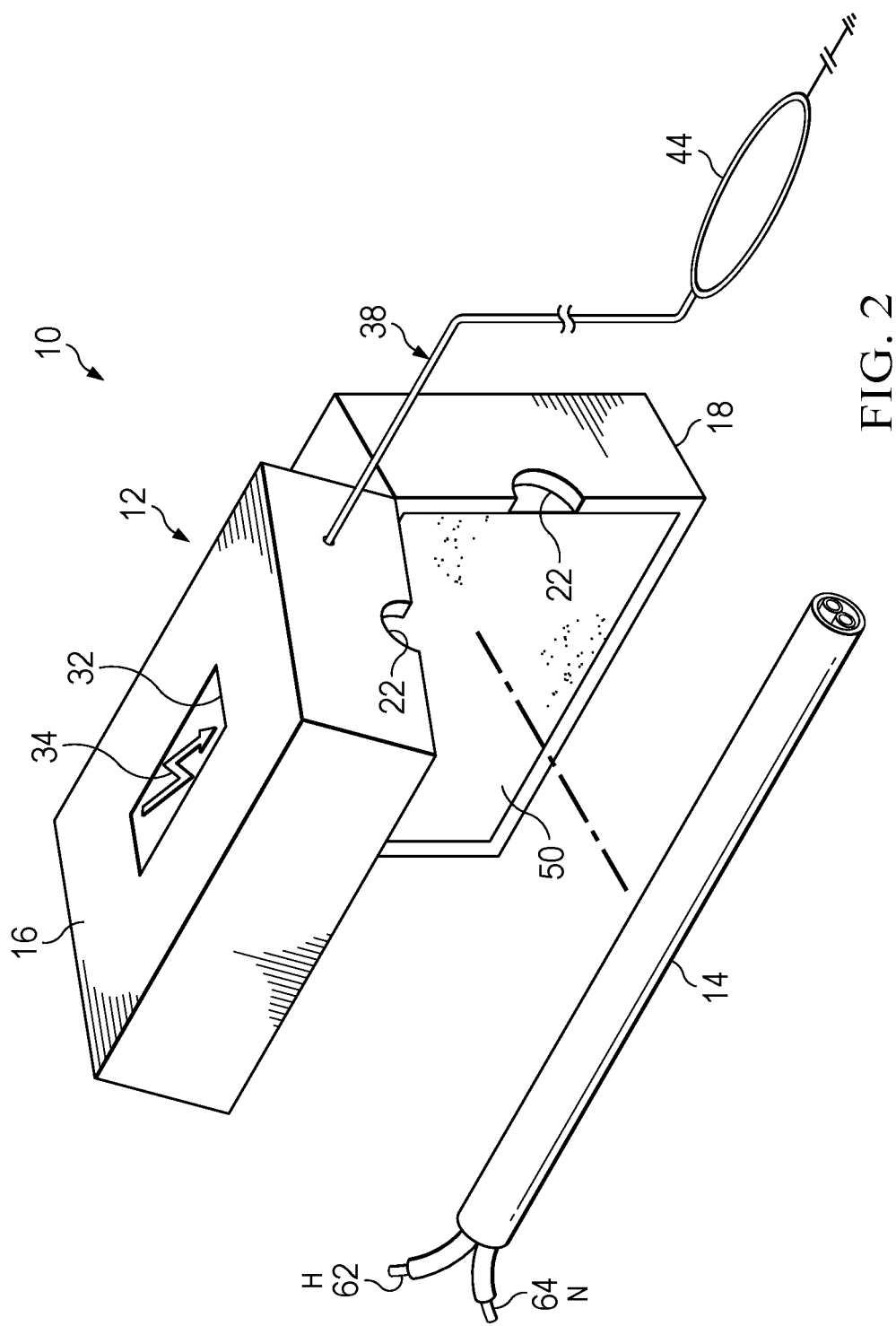
FIG. 2 is a semi-schematic view of the voltage indicator of FIG. 1 in an open configuration adjacent to a two-conductor power cord.

A representative voltage indicator 10 according to the present disclosure is shown in an exploded semi-schematic view in FIG. 1, and in a corresponding collapsed view in FIG. 2.

As shown, voltage indicator 10 includes a housing 12 that is configured to be reversibly closed around a power cord 14. The power cord of FIGS. 1 and 2 is depicted to be a grounded power cord, but can also be an ungrounded power cord, or any other power cord typically used in a household or industrial setting to energize an appliance or piece of equipment.

Housing 12 includes an upper housing 16 and lower housing 18 that, in combination, form an internal volume that within which the internal components of voltage indicator 10 are enclosed. Housing 12 is typically substantially nonconductive, in order to avoid unwanted electrical interference with the detection of voltage in power cord 14. Housing 12 can be fashioned from any appropriate nonconductive material, but for the sake of simplicity and economy the housing 12 is typically fashioned from plastic. A variety of plastic formulations may be appropriate for the preparation of housing 12, depending on exactly how housing 12 is to be manufactured.

Upper housing 16 and lower housing 18 can be separate components of housing 12, or upper housing 16 and lower housing 18 can be hinged, for example where they contact one another at the rear of housing 12. When upper housing 16 and lower housing 18 are hinged, as shown in FIG. 2, housing 12 can be said to have a 'clamshell' configuration, that is, housing 12 forms a clamshell that can be reversibly closed around power cord 14.

Figure 3:
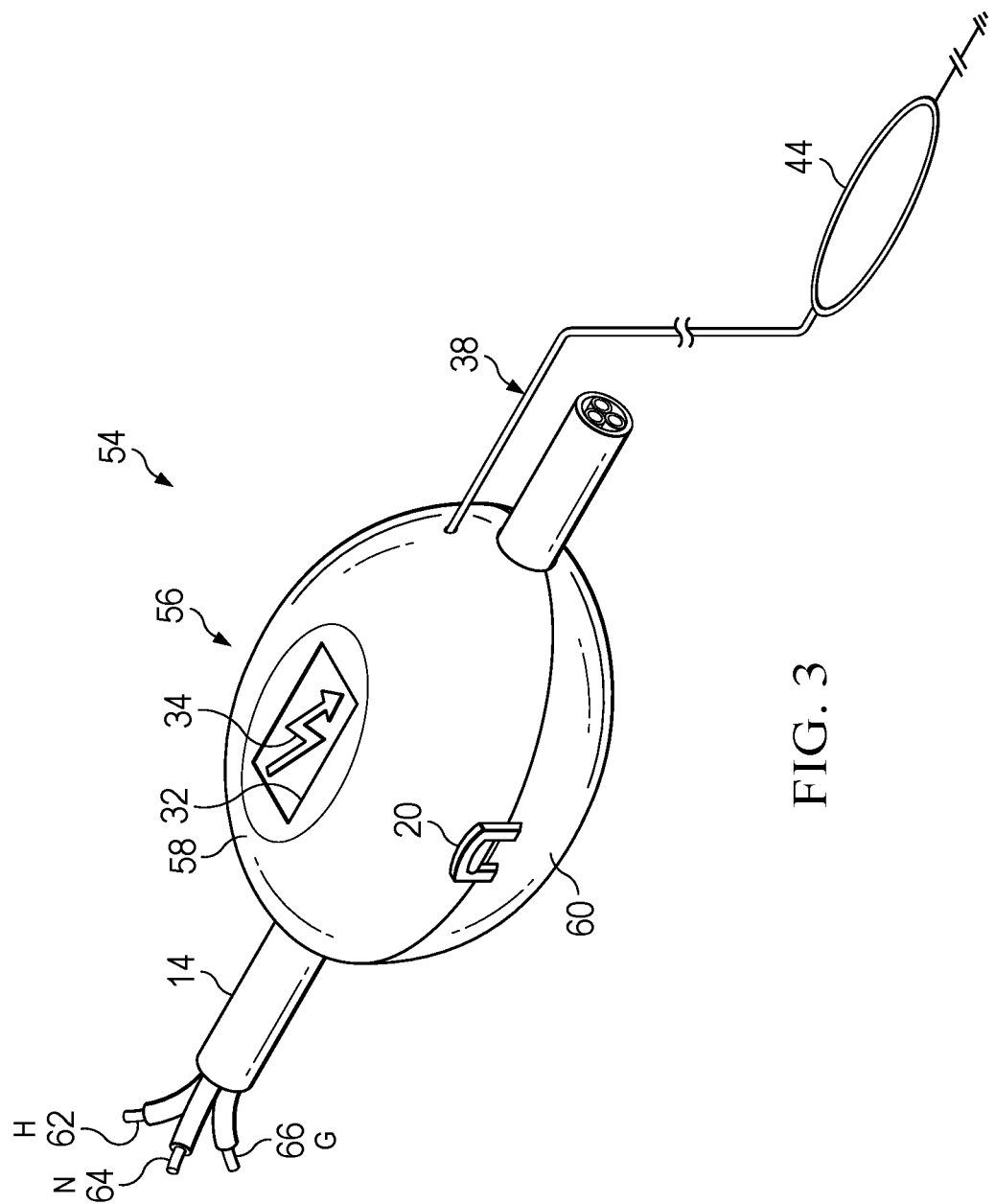
FIG. 3 is a semi-schematic view of an alternative and exemplary voltage indicator according to the present disclosure.

When closed around power cord 14, housing 12 is typically secured to power cord 14 by a reversible closure connecting upper housing 16 and lower housing 18. For example, one of upper housing 16 and lower housing 18 may include a circumferential flange along a lip of the housing while the other of upper housing 16 and lower housing 18 includes a complementary recess along a lip of the housing, such that insertion of the flange into the recess creates a frictional interaction between the flange and the recess that reversibly closes housing 12. Alternatively, or in addition, upper housing 16 and lower housing 18 may be secured by a closure or releasable fastener. In one aspect of the voltage indicator, the closure or releasable fastener is a latch 20, such as is commonly used to secure plastic containers, an example of which is shown in FIG. 3.

As it can be preferable for voltage indicator to be firmly and securely coupled with power cord 14, housing 12 can incorporate one or more recesses 22 in one or more edges of the boundary between upper housing 16 and lower housing 18, in order to accommodate the presence of power cord 14 when housing 12 is closed around the power cord, as shown in FIG. 1. Recesses 22 can be symmetric on both upper housing 16 and lower housing 18 (as shown), or asymmetrically formed on only one of upper housing 16 and lower housing 18. Recesses 22 can be sized to accept a power cord of the desired circumference, but preferably are sized so that a range of power cord sizes can be accommodated.

Voltage indicator 10 can include a status indicator 24 that in turn includes a high-impedance display 26. High-impedance display 26 includes a first display electrode 28 and a second display electrode 30. Status indicator 24 is selected so that the application of an appropriate current across the first display electrode 28 and the second display electrode 30 will create an observable change in high-impedance display 26, represented by lightning bolt icon 34. By "an appropriate current" is mean the amount of current that can be obtained via parasitic capacitive coupling with a power cord when the power cord is energized with a standard 120 volts or 240 volts alternating current voltage. High-impedance display 26 may, for example, include a statically-driven liquid crystal display (LCD), which may require only a very low amount of power for activation.

For example, a high-impedance display 26 that is suitable for the purposes of the present disclosure is a statically-driven LUMEX™ LCD display (State Drive Co., Palatine, Ill.). The LUMEX™ LCD display may require only 1.0 volt at 50 to 60 Hz, and require a current of only one microampere for its operation. It should be realized that a variety of suppliers may provide a wide array of suitable displays and display types that can be used in the presently disclosed voltage indicators.

Any clearly visible change in the appearance of the high-impedance display can be a suitable change in appearance for the purposes of the present disclosure. For example, the appearance of one or more symbols such as dashes or bars can be sufficient to indicate the presence of an AC current in power cord 14. Alternatively, or in addition, a more specialized symbol such as a lightning bolt icon 34 (as shown in FIGS. 1, 2, and 3) or a textual message can be a suitable observable change indicating that an AC current is detectable in power cord 14.

Where housing 12 is transparent or significantly transparent, high-impedance display 26 may be observed through the material of the housing itself, permitting the user to determine the appearance of the high-impedance display. Alternatively, status indicator 24 with high-impedance display 26 can be mounted in alignment with an aperture 32 or a transparent window in housing 12, as shown for voltage indicator 10 of FIGS. 1 and 2.

The performance of voltage indicator 10 can be improved by including a static suppression resistor 36 electrically coupled in parallel with high-impedance display 26. The exact resistance value of static suppression resistor 36 is not critical to operation of voltage indicator 10, and can vary from about 5 megaohm to about 22 megohm.

Voltage indicator 10 further includes a conductive wire 38 having a first end 40 and a second end 42, where conductive wire 38 is electrically coupled to second display electrode 30 at first end 40 of conductive wire 38, and electrically coupled to a conductive grounding loop 44 of wire at second end 42 of conductive wire 38. By attaching conductive wire 38 and conductive grounding loop 44 to second display electrode 30, a pathway is created to permit the small currents needed by high-impedance display 26 to pass through the display. That is, conductive wire 38 and conductive grounding loop 44 replace the necessity of a user making physical contact with second display electrode 30 in order to activate the voltage indicator display, and so the status of power cord 14 can be determined without requiring contact with voltage indicator 10.

Although the particular configuration of conductive wire 38 and conductive grounding loop 44 can be varied without altering the operation of the voltage indicator of the present disclosure, in one aspect of the disclosed voltage indicator conductive wire 38 can be 20 to 40 inches in length, and conductive grounding loop 44 can be configured to have a circumference of 15 to 25 inches. During operation, conductive wire 38 can be arranged on a level surface, or can be suspended from voltage indicator 10, such that conductive grounding loop 44 can be arranged on the level surface, such as on a table surface or upon the ground, or conductive grounding loop 44 can be freely suspended from conductive wire 38.

The various electronic components of voltage indicator 10 discussed herein can be mounted and/or electronically coupled to a substrate 46, including for example status indicator 24, static suppression resistor 36, and any additionally desired diodes, capacitors, resistors, or other components that may aid in the operation or and/or improve the efficiency of voltage indicator 10. Substrate 46 can be any suitable material for securing electronic components, such as breadboard (perf board), a plastic substrate purpose-made for voltage indicator 10, a printed circuit board that includes and/or electronically connects the desired electronic components, or any other suitable material and construction.

Voltage indicator 10 further includes a first carbon-impregnated conductive foam pad 48 and a second carbon-impregnated conductive foam pad 50, where first carbon-impregnated conductive foam pad 48 is electrically coupled to first display electrode 28, and the first and second carbon-impregnated conductive foam pads 48 and 50 are positioned within housing 12 such that when upper housing 16 and lower housing 18 are reversibly closed around power cord 14 the first and second carbon-impregnated conductive foam pads 48 and 50 can be urged into contact with one another with power cord 14 sandwiched between them.

Carbon-impregnated conductive foam pads are readily commercially available, and typically include a polymer foam that has been impregnated with conductive activated carbon. Any suitable polymer can be used to create the foam structure, such as neoprene, polyurethane, and polyethylene, among others. The resulting carbon-impregnated neoprene, carbon-impregnated polyurethane, and carbon-impregnated polyethylene conductive foams, among others, may be used to protect electronic components by dissipating static charges.

As first carbon-impregnated conductive foam pad 48 and second carbon-impregnated conductive foam pad 50 are electrically conductive, the contact between first carbon-impregnated conductive foam pad 48 and second carbon-impregnated conductive foam pad 50 effectively function as a block of conductive material surrounding power cord 14, such that when power cord 14 is energized with an alternating current, a corresponding capacitive coupling takes place, and a small current is therefore applied across high-impedance display 26, thereby creating the desired observable change in high-impedance display 26, such as lightning bolt icon 34

The voltage indicators of the present disclosure may include an insulating panel 52 separating first carbon-impregnated conductive foam pad 48 from the electronic components of the voltage indicator. Insulating panel 52 may be formed from any suitably inexpensive nonconducting material, such as for example cardboard.

Typically, the resilient nature of the carbon-impregnated conductive foam used in the voltage indicators of the present disclosure provides sufficient inward pressure on power cord 14 that the conductive foam snugly closes around the power cord, with no gaps or air spaces between them. This ensures that the conductive foam is closely coupled with an internal conductor of the power cord, and accurate detection of AC current is possible. The voltage indicators of the present disclosure may incorporate one or more additional components to ensure that the conductive foam pads are urged toward the power cord with sufficient force. One or more biasing devices (such as a spring) or sufficiently resilient material (rubber or elastic) may be incorporated into the voltage indicator to create the necessary contact with the power cord, if necessary.

Although voltage indicator 10 as depicted in FIGS. 1 and 2 includes a housing that is a rectangular cuboid, the particular conformation of a voltage indicator housing of the present disclosure is a matter of design choice, provided that the selected housing defines a volume sufficient to enclose the components of the voltage indicator, and is capable of being reversibly coupled to a desired power cord. For example, a voltage indicator 54 is depicted semi-schematically in FIG. 3 having a housing 56 that is generally ovoid in shape. As shown, housing 56 may also include an upper housing 58 and a lower housing 60. Upper housing 58 and lower housing 60 may be reversibly closed around power cord 14 by any appropriate closure, including latch 20, as shown. The size, shape, and color of the voltage indicator housings of the present disclosure can be selected so as to complement the decor of a given location, so as to be as unobtrusive as possible. This can be particularly desirable when the voltage indicator is to be used within a home or an office space.

Figure 4:
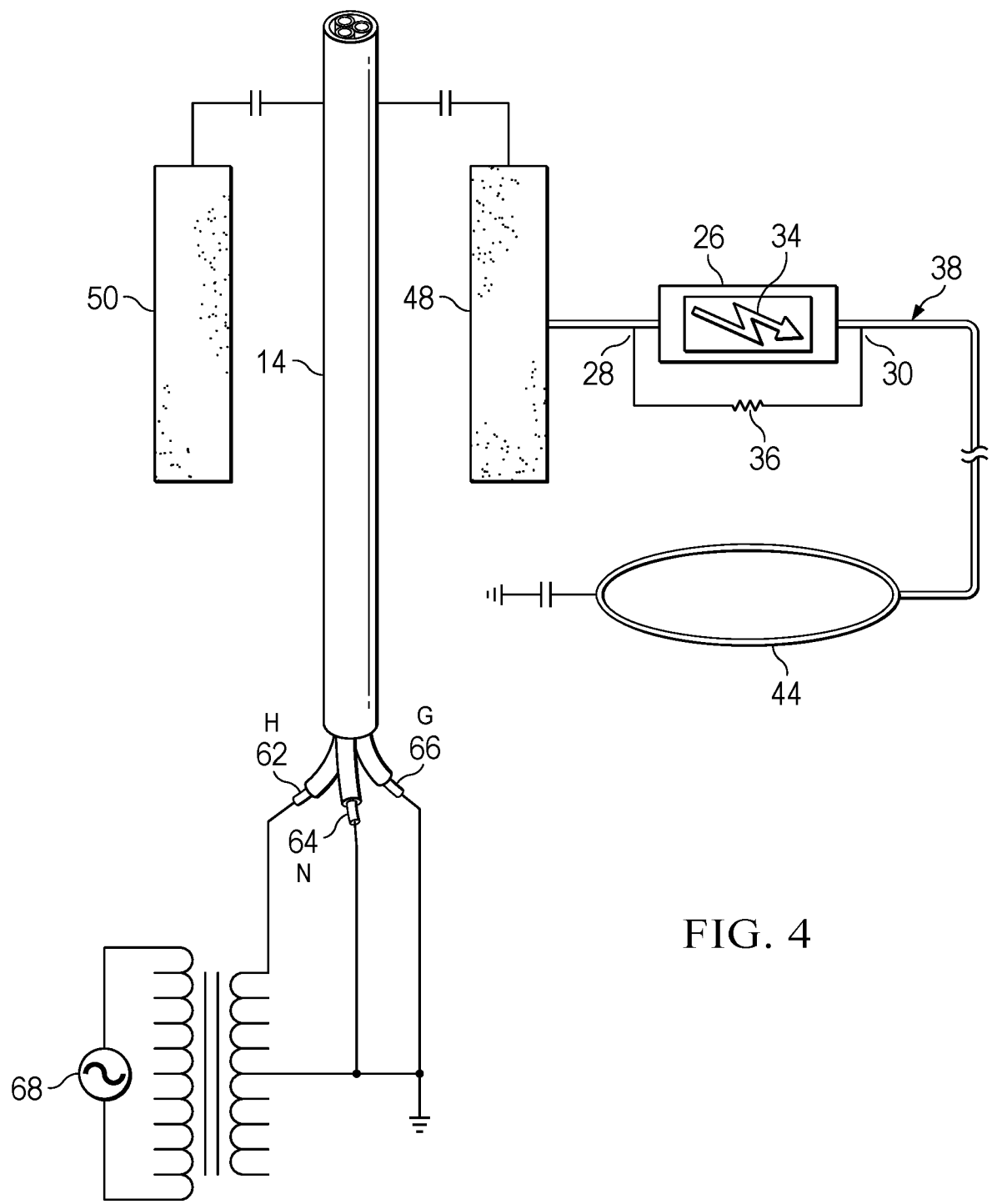
FIG. 4 is a diagram showing a voltage indicator of the present disclosure capacitively coupled with a grounded power cord.

FIG. 4 provides a schematic diagram of a voltage indicator 10 according to the present disclosure that is capacitively coupled with a three-conductor power cord 14, including a hot conductor 62, a neutral conductor 64, and a grounded conductor 66. As shown, power cord 14 is electrically connected to a conventional alternating current power source 68, and voltage indicator 10 is capacitively coupled with hot conductor 62 of power cord 14 via first and second carbon-impregnated conductive foam pads 48 and 50. First carbon-impregnated conductive foam pad 48 is connected to first display electrode 28 of high-impedance display 26, while the second display electrode 30 is connected to conductive wire 38 and conductive grounding loop 44, which functions as a ground for the voltage indicator. Static suppression resistor 36 is shown connected in parallel to high-impedance display 26.

If power cord 14 is energized, high-impedance display 26 can be energized by the small amount of current developed in the block of carbon-impregnated foam pads 48 and 50. This small current is sufficient to activate high-impedance display 26 and thereby register an observable change, in one example by displaying the image of a lightning bolt icon 34.

If the power cord 14 is not energized, high-impedance display 26 remains off when voltage indicator 10 is mounted to/coupled with power cord 14. Since voltage indicator 10 is sensitive to alternating voltage in power cord 14 at any location along the power cord, voltage indicator 10 may be placed on the power cord at any convenient location where the high-impedance display 26 can be easily viewed.

Figure 5:
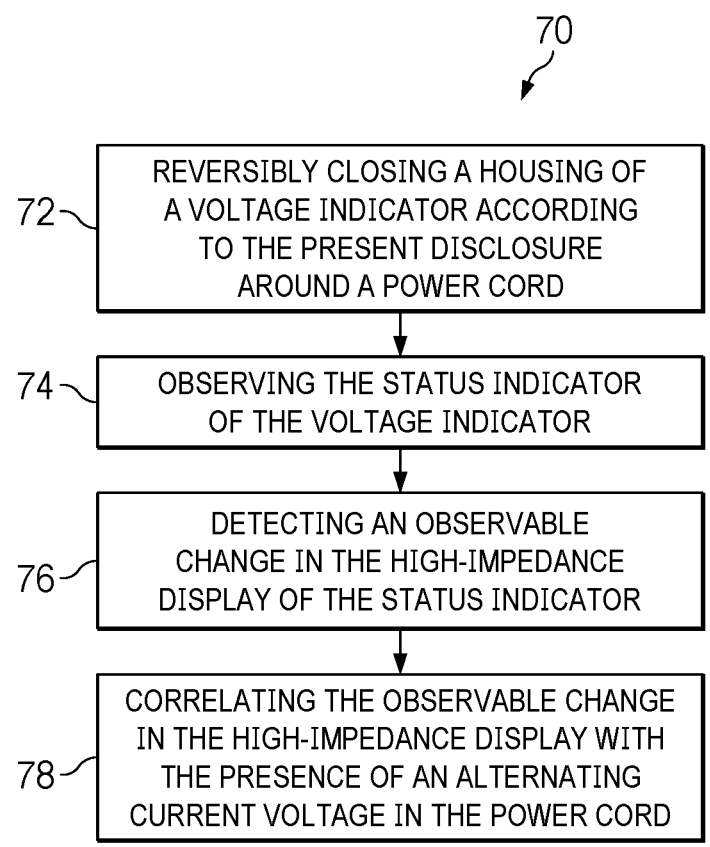
FIG. 5 is a flowchart depicting an exemplary method of indicating a presence of an alternating current voltage in an electrical conductor within a power cord, according to the present disclosure.

The voltage indicators of the present disclosure lend themselves to the performance of a method of indicating a presence of an alternating current voltage in an electrical conductor within a power cord, as shown in flowchart 70 of FIG. 5. The method comprises reversibly closing the housing of a voltage indicator according to the present disclosure around the power cord, as shown at step 72 of flowchart 70; observing the status indicator of the voltage indicator, as shown at step 74 of flowchart 70; detecting an observable change in the high-impedance display of the status indicator, as shown at step 76 of flowchart 70; and correlating the observable change in the high-impedance display of the status indicator with the presence of an alternating current voltage within the power cord, as shown at step 78 of flowchart 70.

Figure 6:
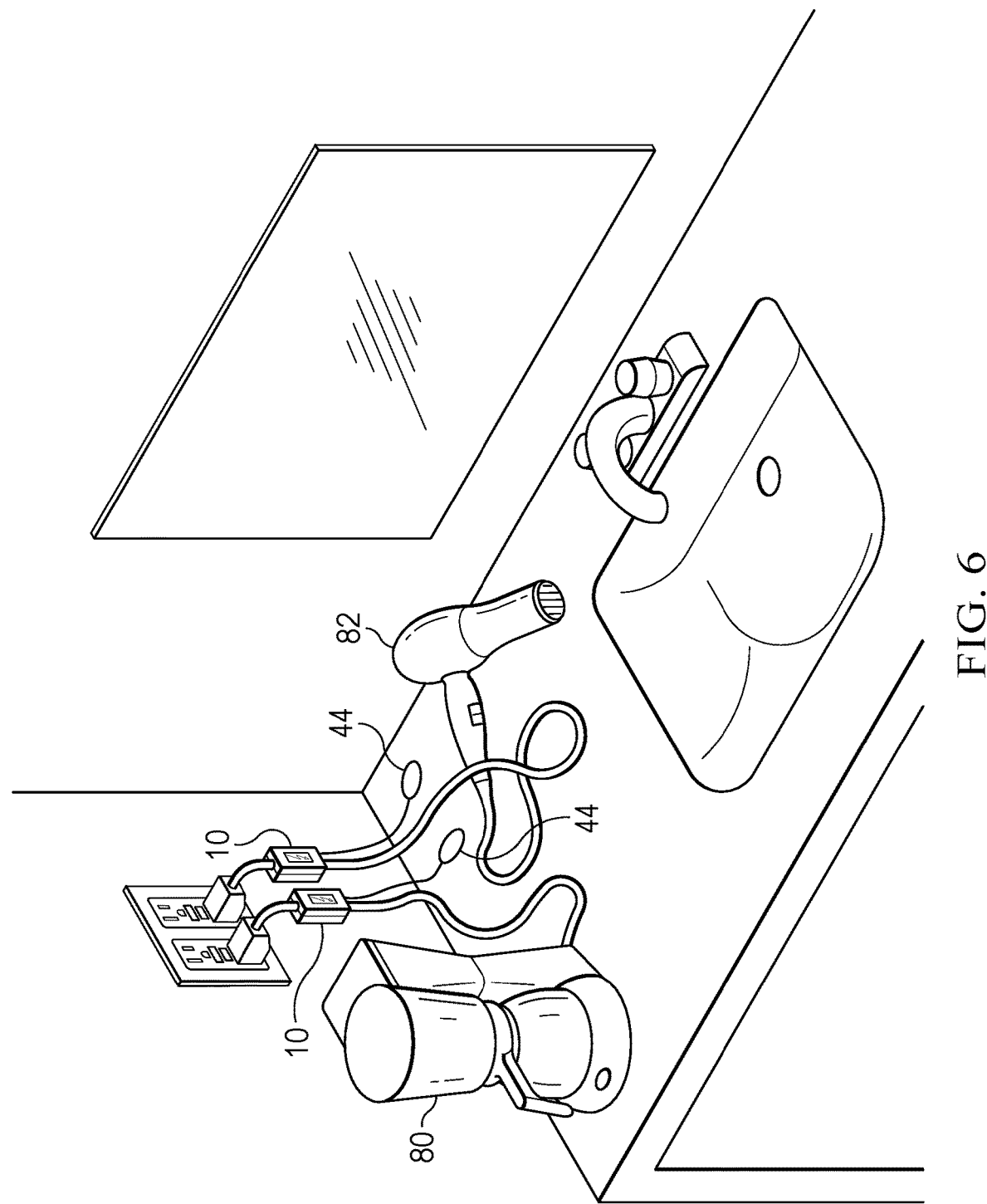
FIG. 6 illustrates the potential uses of a voltage indicator of the present disclosure in a bathroom.
Figure 7:
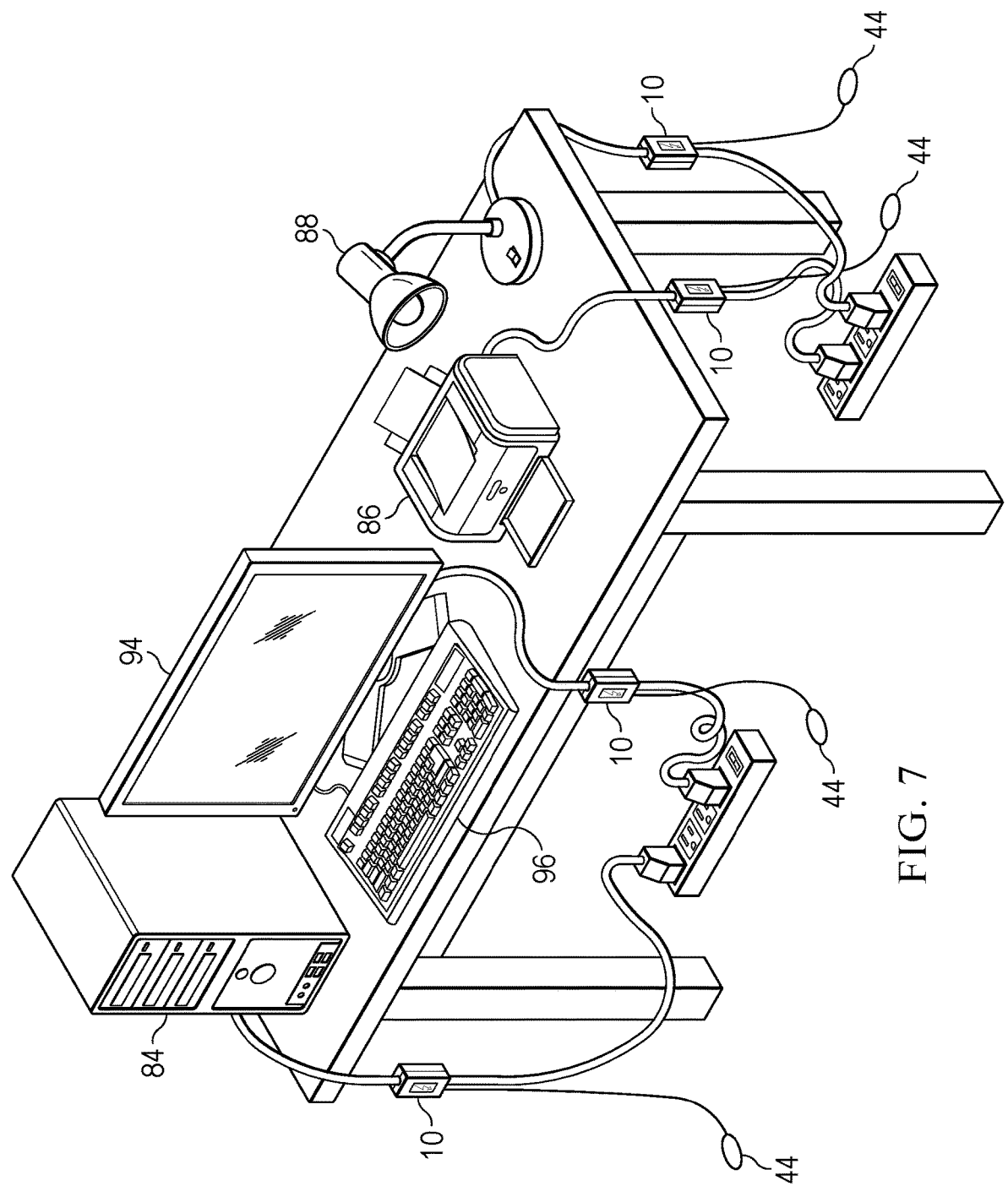
FIG. 7 illustrates the potential uses of a voltage indicator of the present disclosure with a selection of desktop electronic devices.
Figure 8:
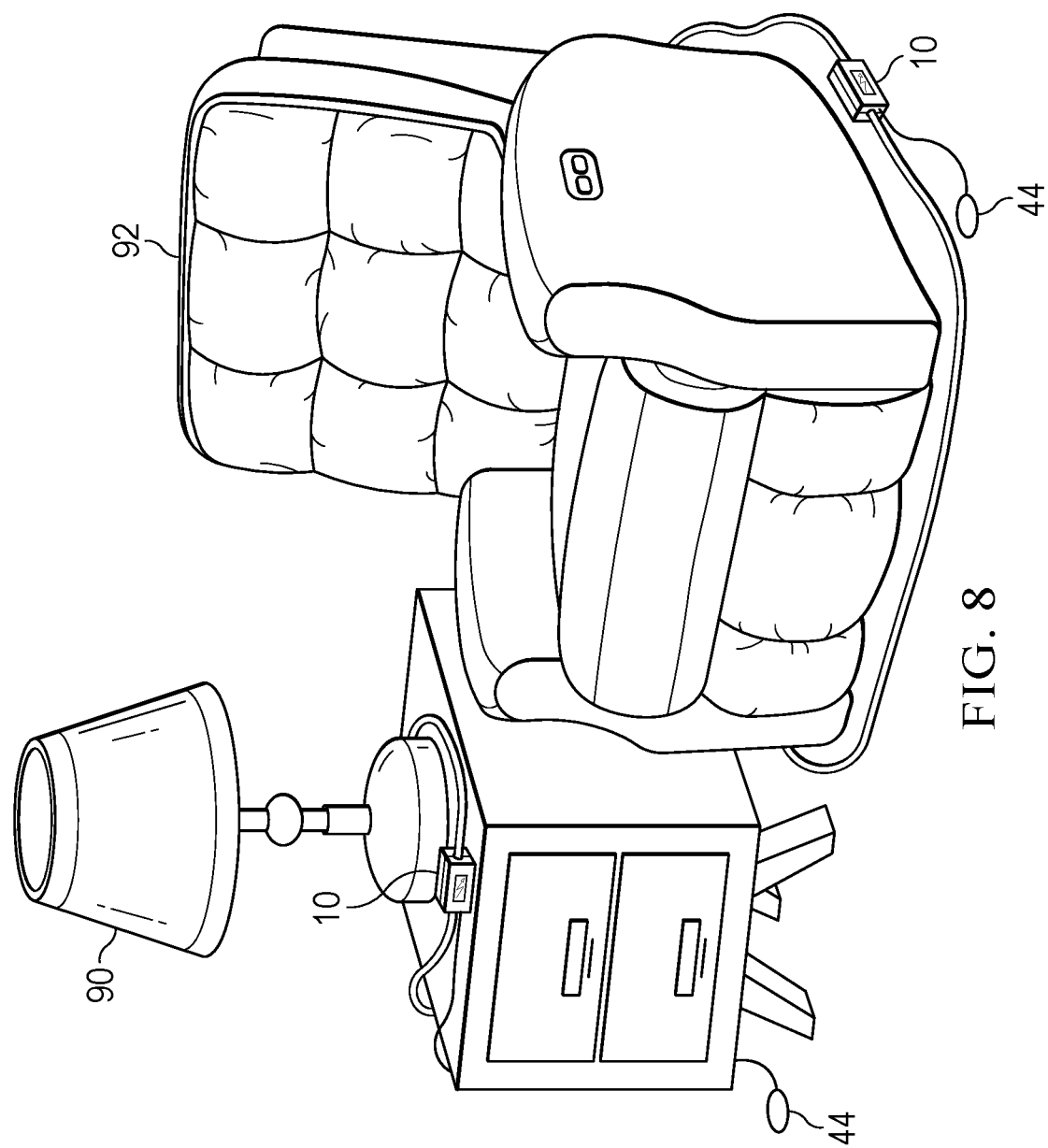
FIG. 8 illustrates the potential use of a voltage indicator of the present disclosure with a table top lamp in a living area.

The voltage indicators of the present disclosure may be employed in any of a wide variety of environments, wherever it may be desirable to visually confirm that a power cord or extension cord is energized. For example, as illustrated in FIG. 6, voltage indicators 10 of the present disclosure can be used in a bathroom, such as a hotel bathroom, to indicate whether a small appliance such as a coffee maker 80 or hair dryer 82 are energized. As illustrated in FIG. 7, voltage indicators 10 can be used in a home or office to indicate whether a desktop appliance such as computer tower 84, printer 86, or desk lamp 88 are energized, among others. Similarly, FIG. 8 illustrates a voltage indicator 10 of the present disclosure being used in conjunction with a table top lamp 90 and a powered recliner 92 in a living area of a home.

The voltage indicators of the present disclosure are not strictly limited to the exemplary embodiments illustrated and described, but can be modified and configured in various ways. The size and shape, composition and materials used may be adapted according to an intended application, and may be easily adapted by one of skill in the art with knowledge of the present disclosure.

In the description and the claims, "substantially" means a deviation of up to 10% of the stated value, if physically possible, both downward and upward, otherwise only in the appropriate direction; in the case of degrees (angle and temperature), this means ±10°. If there are terms such as "substantially constant" etc., what is meant is the technical possibility of deviation which a person skilled in the art takes as a basis and not the mathematical one. For example, a "substantially L-shaped cross-section" comprises two elongated surfaces, which each merge at one end into the end of the other surface, and whose longitudinal extension is arranged at an angle of 45° to 120° to one another.

All given quantities and percentages, in particular those relating to the limitation of the disclosure, insofar as they do not relate to specific examples, are understood to have a tolerance of ±10%; accordingly, for example: 11% means: from 9.9% to 12.1%. With terms such as "a guide," the word "a" is not to be considered as representing a singular numeral, but rather is to be considered an indefinite article or pronoun, unless the context indicates otherwise.

Unless otherwise stated, the term "combination" or "combinations" mean all types of combinations, starting from two of the relevant components up to a plurality or all of such components; the term "containing" also means "consisting of."

The features and variants stated in the individual embodiments and examples can be freely combined with those of the other examples and embodiments and in particular can be used for characterizing the invention in the claims without necessarily including the other details of the particular embodiment or of the particular example.

REFERENCE NUMBERS

10—Voltage indicator
12—Housing
14—Power cord
16—Upper housing
18—Lower housing
20—Latch
22—Recesses
24—Status indicator
26—High-impedance display
28—First display electrode
30—Second display electrode
32—Aperture
34—Lightning bolt icon
36—Static suppression resistor
38—Conductive wire
40—First end of conductive wire
42—Second end of conductive wire
44—Conductive grounding loop
46—Substrate
48—First carbon-impregnated conductive foam pad
50—Second carbon-impregnated conductive foam pad
52—Insulating panel
54—Voltage indicator
56—Housing
58—Upper Housing
60—Lower Housing
62—Hot conductor (H)
64—Neutral conductor (N)
66—Grounded conductor (G)
68—Alternating current power source
70—Flowchart
72—Flowchart step
74—Flowchart step
76—Flowchart step
78—Flowchart step
80—Coffee maker
82—Hair dryer
84—Computer tower
86—Printer
88—Desk lamp
90—Table top lamp
92—Power recliner
94—Monitor
96—Keyboard

What is claimed is:

1. A voltage indicator for a power cord, comprising:
a housing, the housing being configured to be reversibly closed around the power cord;
a status indicator, the status indicator including a high-impedance display having a first display electrode and a second display electrode that are connected in parallel with a static suppression resistor, the status indicator being disposed in or on the housing so that the high-impedance display is visible when the housing is closed around the power cord, where an application of a current across the first and the second display electrodes creates an observable change in the high-impedance display;
a conductive wire that is electrically coupled to the second display electrode at a first end of the conductive wire, and electrically coupled to a conductive grounding loop at a second end of the conductive wire; and
a first carbon-impregnated conductive foam pad and a second carbon-impregnated conductive foam pad, where the first carbon-impregnated conductive foam pad is electrically coupled to the first display electrode, and the first and second carbon-impregnated conductive foam pads are positioned such that when the housing is reversibly closed around the power cord the first and second carbon-impregnated conductive foam pads are in contact with one another and the power cord is sandwiched between them;
wherein when the housing is reversibly closed around the power cord, a presence of an alternating current voltage in an electrical conductor within the power cord capacitively couples with the first carbon-impregnated conductive foam pad and the second carbon-impregnated conductive foam pad, resulting in the observable change in the high-impedance display.

2. The voltage indicator of claim 1, wherein the housing has a clamshell configuration and the housing can be reversibly closed around the power cord.

3. The voltage indicator of claim 1, wherein the housing can be secured to the power cord by a releasable fastener.

4. The voltage indicator of claim 1 wherein the high-impedance display includes a liquid crystal display.

5. The voltage indicator of claim 1, wherein the conductive wire is 20 to 40 inches in length.

6. The voltage indicator of claim 1, wherein the conductive grounding loop has a circumference of 15 to 25 inches.

7. The voltage indicator of claim 1, wherein the first and second carbon-impregnated conductive foam pads are selected from carbon-impregnated neoprene, carbon-impregnated polyurethane, and carbon-impregnated polyethylene.

8. The voltage indicator of claim 1, wherein the first and second carbon-impregnated conductive foam pads are impregnated with activated carbon.

9. A method of indicating a presence of an alternating current voltage within a power cord, comprising:
reversibly closing a housing of a voltage indicator around the power cord, wherein the voltage indicator includes:
a status indicator having a high-impedance display, where the status indicator is disposed in or on the housing so that the high-impedance display is visible when the housing is closed around the power cord; the high-impedance display having a first display electrode and a second display electrode that are connected in parallel with a static suppression resistor, such that an application of a current across the first and the second display electrodes creates an observable change in the high-impedance display;

a conductive wire that is electrically coupled to the second display electrode at a first end of the conductive wire, and electrically coupled to a conductive grounding loop at a second end of the conductive wire; and a first carbon-impregnated conductive foam pad and a second carbon-impregnated conductive foam pad, where the first carbon-impregnated conductive foam pad is electrically coupled to the first display electrode, and the first and second carbon-impregnated conductive foam pads are positioned such that when the housing is reversibly closed around the power cord the first and second carbon-impregnated conductive foam pads are in contact with one another and the power cord is sandwiched between them;

wherein when the housing is reversibly closed around the power cord, a presence of an alternating current voltage in an electrical conductor within the power cord capacitively couples with the first carbon-impregnated conductive foam pad and the second carbon-impregnated conductive foam pad, resulting in the observable change in the high-impedance display;

observing the status indicator;

detecting an observable change in the high-impedance display of the status indicator; and correlating the observable change in the high-impedance display with the presence of the alternating current voltage within the power cord.

10. The method of claim 9, wherein the housing of the voltage indicator has a clamshell configuration, and reversibly closing the housing of the voltage indicator around the power cord includes reversibly closing the clamshell around the power cord.

11. The method of claim 9, wherein the conductive wire of the voltage indicator is 20 to 40 inches in length and the conductive grounding loop has a circumference of 15 to 25 inches, and reversibly closing the housing of the voltage indicator around the power cord includes permitting the conductive grounding loop to rest upon a level surface.

* * * * *